US011086239B2

(12) United States Patent
Yu et al.

(10) Patent No.: US 11,086,239 B2
(45) Date of Patent: Aug. 10, 2021

(54) CLEANING DEVICE AND METHOD OF CLEANING

(71) Applicant: ASML NETHERLANDS B.V., Veldhoven (NL)

(72) Inventors: Miao Yu, Best (NL); Petrus Martinus Gerardus Johannes Arts, Echt (NL); Erik Henricus Egidius Catharina Eummelen, Veldhoven (NL); Giovanni Luca Gattobigio, Eindhoven (NL); Maarten Holtrust, Eindhoven (NL); Han Henricus Aldegonda Lempens, Weert (NL); Ferdy Migchelbrink, Veldhoven (NL); Theodorus Wilhelmus Polet, Geldrop (NL); Gheorghe Tanasa, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/981,813

(22) PCT Filed: Mar. 13, 2019

(86) PCT No.: PCT/EP2019/056224
§ 371 (c)(1),
(2) Date: Sep. 17, 2020

(87) PCT Pub. No.: WO2019/201516
PCT Pub. Date: Oct. 24, 2019

(65) Prior Publication Data
US 2021/0116824 A1 Apr. 22, 2021

(30) Foreign Application Priority Data

Apr. 16, 2018 (EP) .................................. 18167435

(51) Int. Cl.
*G03F 7/20* (2006.01)

(52) U.S. Cl.
CPC ........ *G03F 7/70925* (2013.01); *G03F 7/2041* (2013.01); *G03F 7/70341* (2013.01)

(58) Field of Classification Search
CPC ............. G03F 7/70341; G03F 7/70875; G03F 7/70925

(Continued)

(56) References Cited

U.S. PATENT DOCUMENTS 9,632,426 B2 * 4/2017 Peng ................... G03F 7/70925
2004/0207824 A1 10/2004 Lof et al.
(Continued)

FOREIGN PATENT DOCUMENTS

| EP | 1420298 | 5/2004 |
|----|---------|--------|
| EP | 2056164 | 5/2009 |

(Continued)

OTHER PUBLICATIONS

International Search Report and Written Opinion issued in corresponding PCT Patent Application No. PCT/EP2019/056224, dated May 16, 2019.

(Continued)

*Primary Examiner* — Hung Nguyen
(74) *Attorney, Agent, or Firm* — Pillsbury Winthrop Shaw Pittman LLP

(57) ABSTRACT

A cleaning device for an apparatus for processing production substrates, the cleaning device including: a body having dimensions similar to the production substrates so that the cleaning device is compatible with the apparatus, the body having a first major surface and a second major surface facing in the opposite direction to the first major surface; a chamber within the body configured to accommodate contaminants; an inlet from the first major surface to the chamber and configured to allow contaminants to be drawn into the chamber by a flow of fluid; and an outlet from the (Continued)

chamber to the second major surface, the cleaning device being configured to allow the fluid to exit the chamber but to prevent a contaminant leaving the chamber.

20 Claims, 8 Drawing Sheets

(58) Field of Classification Search
USPC .................................................. 355/30, 53
See application file for complete search history.

(56) References Cited

U.S. PATENT DOCUMENTS

| | | | |
|---|---|---|---|
| 2007/0242247 A1* | 10/2007 | Shiraishi | G03F 7/70875 355/53 |
| 2008/0002164 A1 | 1/2008 | Chang et al. | |
| 2008/0186461 A1 | 8/2008 | Shin | |
| 2009/0115979 A1 | 5/2009 | Van Der Heijden et al. | |
| 2009/0190106 A1* | 7/2009 | Sewell | G03F 7/70341 355/30 |
| 2010/0039628 A1 | 2/2010 | Shiraishi et al. | |
| 2011/0199601 A1 | 8/2011 | Kaneko et al. | |
| 2011/0261334 A1 | 10/2011 | Lin | |
| 2012/0180823 A1 | 7/2012 | Peng et al. | |

FOREIGN PATENT DOCUMENTS

| | | |
|---|---|---|
| WO | 99/49504 | 9/1999 |
| WO | 2017008993 | 1/2017 |

OTHER PUBLICATIONS

Taiwanese Office Action issued in corresponding Taiwanese Patent Application No. 108111656, dated Jan. 8, 2020.

* cited by examiner

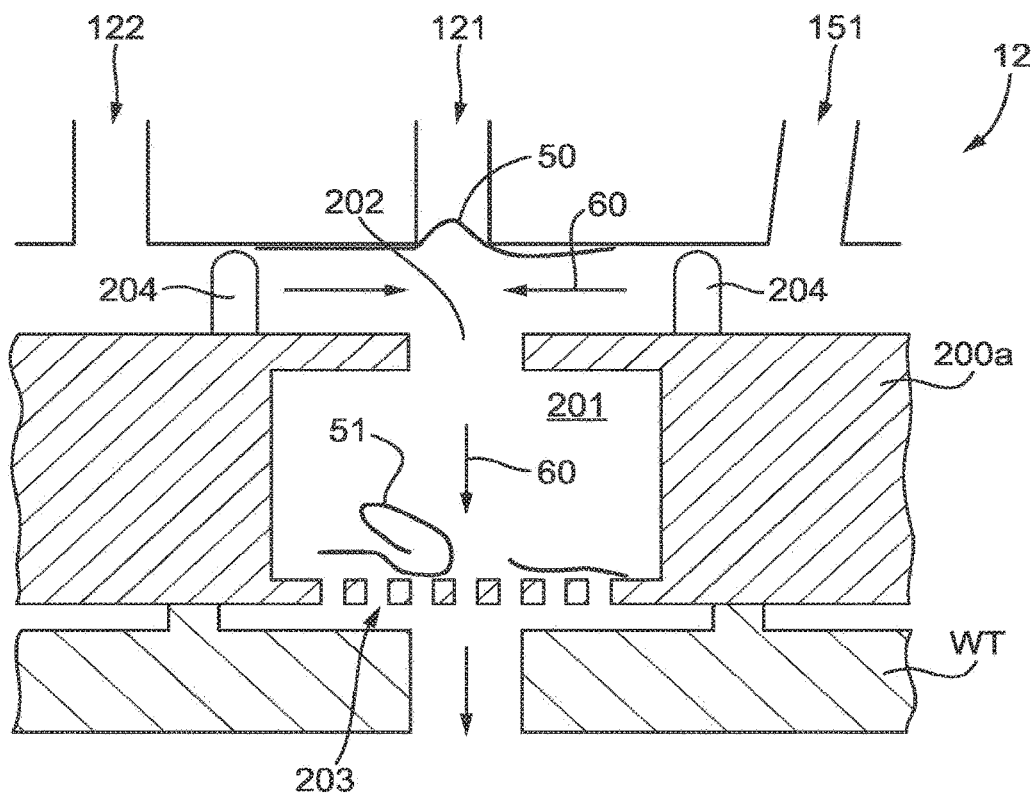
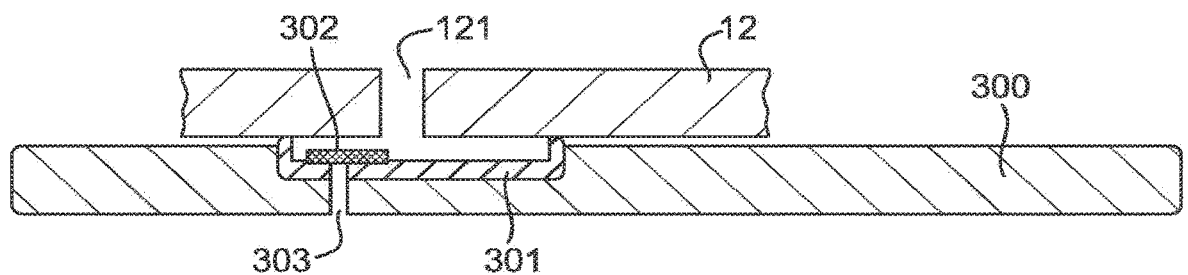

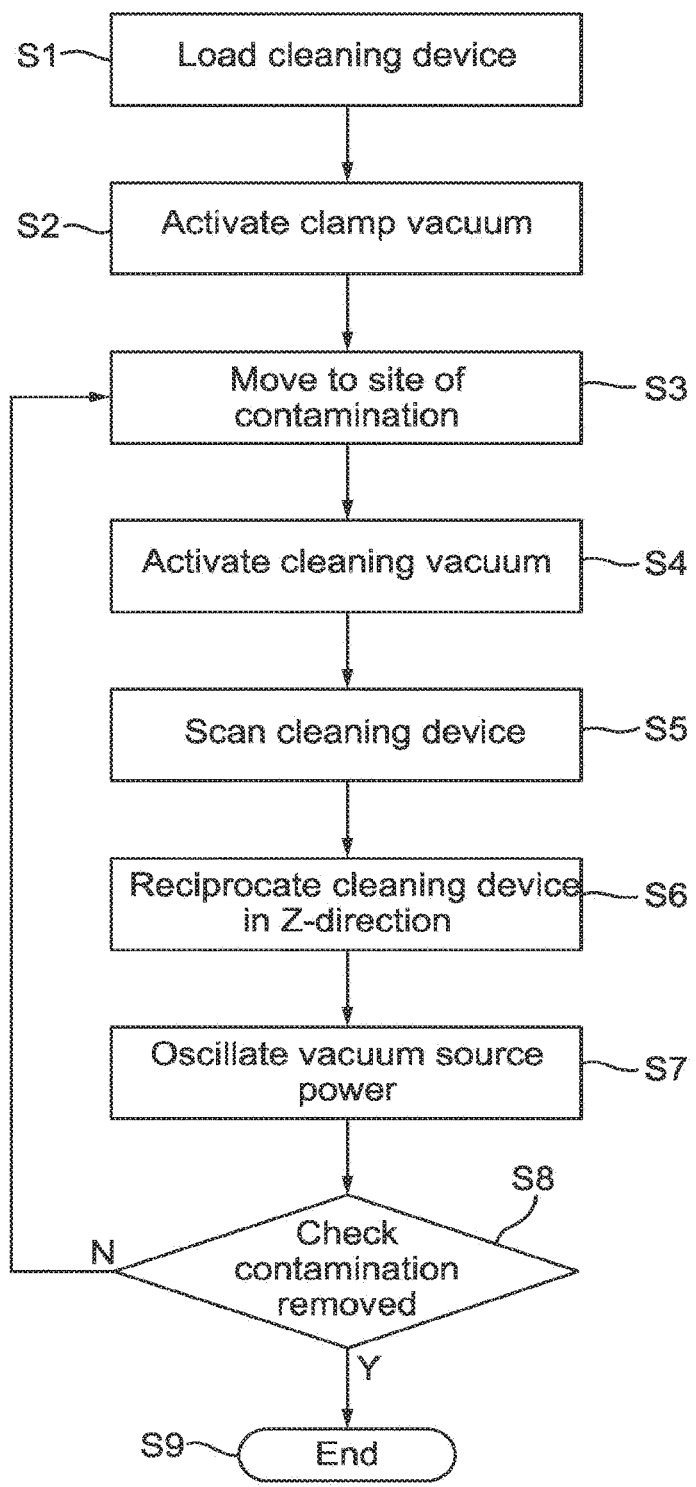

CLEANING DEVICE AND METHOD OF CLEANING

CROSS-REFERENCE TO RELATED APPLICATIONS

This application is the U.S. national phase entry of PCT Patent Application No. PCT/EP2019/056224, which was filed on Mar. 13, 2019, which is based upon and claims the benefit of priority of European patent application no. EP 18167435.9 which was filed on 16 Apr. 2018 and which is incorporated herein in its entirety by reference.

FIELD

The present invention relates to a cleaning device and method of cleaning for use in a lithographic apparatus, metrology apparatus or a process apparatus, for example.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Immersion techniques have been introduced into lithographic systems to enable improved resolution of smaller features. In an immersion lithographic apparatus, a liquid layer of a liquid having a relatively high refractive index is interposed in a space between a projection system of the apparatus (through which the patterned beam is projected towards the substrate) and the substrate. The liquid covers at last the part of the wafer under the final lens element of the projection system. Thus, at least the portion of the substrate undergoing exposure is immersed in the liquid. The effect of the immersion liquid is to enable imaging of smaller features since the exposure radiation will have a shorter wavelength in the liquid than gas. (The effect of the liquid may also be regarded as increasing the effective numerical aperture (NA) of the system and also increasing the depth of focus.)

In commercial immersion lithography, the liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space between the final lens element and a surface facing the final element. The facing surface is a surface of substrate or a surface of the supporting stage (or substrate table) that is co-planar with the substrate surface. (Please note that reference in the following text to surface of the substrate W also refers in addition or in the alternative to a surface of the substrate table, unless expressly stated otherwise; and vice versa). A fluid handling structure present between the projection system and the stage is used to confine the immersion to the immersion space. The space filled by liquid is smaller in plan than the top surface of the substrate and the space remains substantially stationary relative to the projection system while the substrate and substrate table move underneath.

The fluid handling structure is a structure which supplies liquid to the immersion space, removes the liquid from the space and thereby confines liquid to the immersion space. It includes features which are a part of a fluid supply system. The arrangement disclosed in PCT patent application publication no. WO 99/49504 is an early fluid handling structure comprising pipes which either supply or recover liquid from the space and which operate depending on the relative motion of the stage beneath the projection system. In more recent designs of fluid handling structure extends along at least a part of a boundary of the space between the final element of the projection system and the substrate table 60 or substrate W, so as to in part define the space.

A lithographic apparatus is a complex apparatus and most of its critical parts have to be operated under very controlled environments, with higher contamination specifications than standard for cleanrooms. If the apparatus has to be opened up for maintenance or inspection, time consuming processes such as decontamination and start-up may need to be taken before the apparatus can be returned to service. It is desirable that any downtime of the apparatus be minimized as far as possible since this reduces the productivity of the apparatus and increases cost of ownership.

SUMMARY

It is desirable, for example, to provide means to enable critical parts of the apparatus to be cleaned with minimum downtime.

According to an aspect, there is provided a cleaning device for an apparatus for processing production substrates, the cleaning device comprising:

a body having dimensions similar to the production substrates so that the cleaning device is compatible with the apparatus, the body having a first major surface and a second major surface facing in the opposite direction to the first major surface;

a chamber within the body configured to accommodate contaminants;

an inlet from the first major surface to the chamber and configured to allow contaminants to be drawn into the chamber by a flow of fluid; and an outlet from the chamber to the second major surface, the cleaning device being configured to allow the fluid to exit the chamber but to prevent a contaminant leaving the chamber.

According to an aspect, there is provided a method of cleaning an apparatus for processing production substrates, the method comprising:

loading a cleaning device according to any one of the preceding claims onto a substrate holder of the apparatus, the second major surface of the cleaning device 200 being adjacent the substrate holder;

moving the substrate holder having the cleaning device 200 thereon so that an inlet of the cleaning device is adjacent a part of a component of the apparatus to be cleaned; and operating a vacuum source to create an under-pressure between the cleaning device and the substrate holder so that fluid is drawn through the in let, chamber and outlet.

According to an aspect, there is provided a computer program comprising code means that, when executed by the control system of an apparatus for processing production substrates, causes the apparatus for processing production substrates to perform a method as described above.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 depicts in partial cross-section a cleaning device 200 according to another embodiment of the invention in operation;

FIG. 9 depicts in partial cross-section a cleaning device 200 according to another embodiment of the invention in operation;

FIG. 11 is a flow chart of a cleaning method according to an embodiment of the invention.

DETAILED DESCRIPTION

Figure 1:
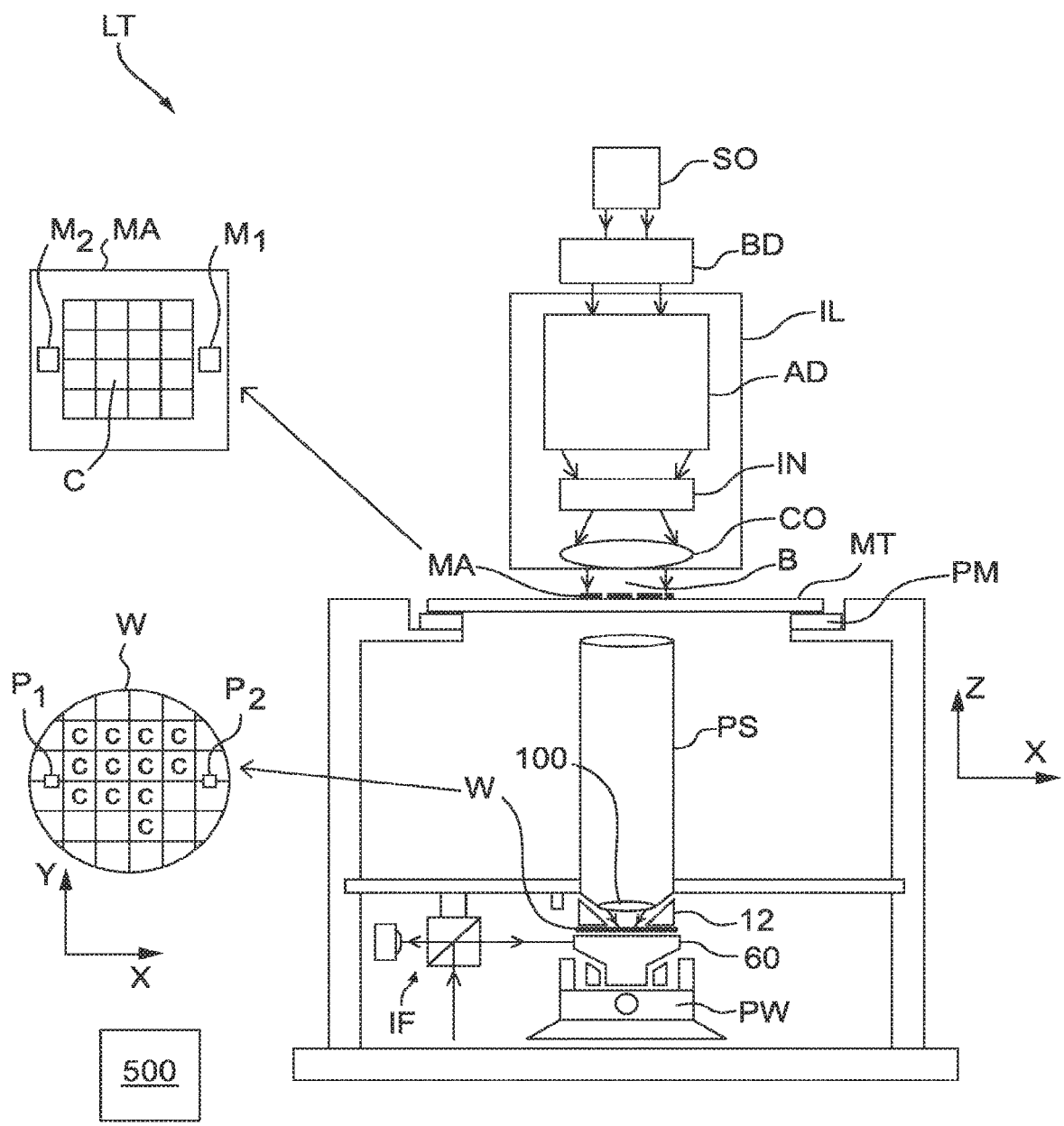
FIG. 1 schematically depicts a lithographic apparatus.

FIG. 1 schematically depicts a lithographic apparatus LT in which an embodiment of the invention can be used. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) 60 or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table 60 can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table 60 or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing liquid between a final lens element 100 of the projection system PS and the substrate can be classed into three general categories. These are the bath type arrangement, the so-called localized immersion systems and the all-wet immersion systems. The present invention relates particularly to the localized immersion systems.

Figure 2:
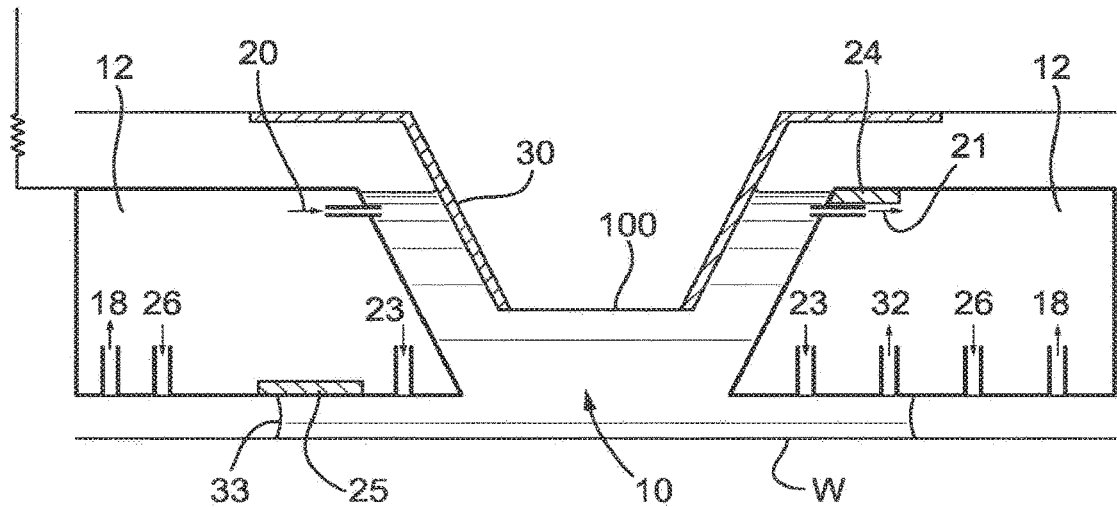
FIG. 2 schematically depicts a immersion liquid confinement structure for use in a lithographic projection apparatus.

In an arrangement which has been proposed for a localized immersion system, a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table 60 which surrounds the substrate or both. Such an arrangement is illustrated in FIG. 2. The arrangement illustrated in FIG. 2 and described below may be applied to the lithographic apparatus described above and illustrated in FIG. 1.

FIG. 2 schematically depicts the liquid confinement structure 12. The liquid confinement structure 12 extends along at least a part of a boundary of the immersion space 10 between the final lens element 100 of the projection system PS and the substrate table 60 or substrate W. In an embodiment, a seal is formed between the liquid confinement structure 12 and the surface of the substrate W/substrate table 60. The seal may be a contactless seal such as a gas seal or a liquid seal and liquid to the immersion space 10. Examples of systems with a gas seal are disclosed in European patent application publication no. EP-A-1,420, 298. Liquid is brought into the immersion space 10 by liquid inlet 13. The liquid may be removed by liquid outlet 13.

United States patent application publication no. US 2004-0207824. Other liquid confinement systems 12 can be used with the present invention.

Figure 3:
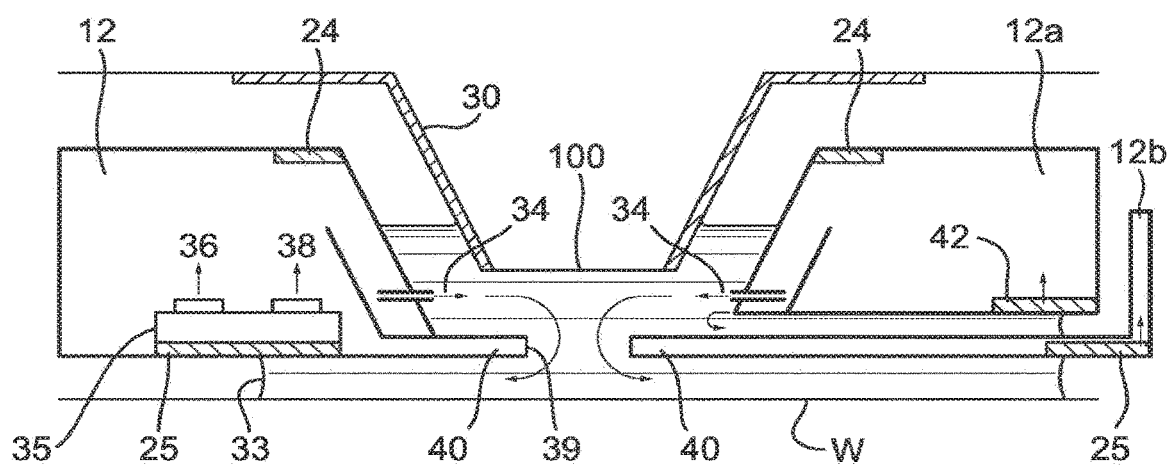
FIG. 3 is a side cross sectional view that schematically depicts a further immersion liquid supply system according to an embodiment.

FIGS. 2 and 3 show different features which may be present in variations of confinement structure 12. The designs may share some of the same features as FIG. 2 unless described differently. The features described herein may be selected individually or in combination as shown or as required.

FIG. 2 shows a confinement structure 12 around the bottom surface of a last lens element. The last lens element 100 has an inverted frustro-conical shape 30. The frustro-conical shape has a planar bottom surface and a conical surface. The frustro-conical shape protrudes from a planar surface and has a bottom planar surface. The bottom planar surface is the optically active portion of the bottom surface of the last lens element, through which the projection beam may pass. The confinement structure surrounds at least part of the frustro-conical shape. The confinement structure has an inner-surface which faces towards the conical surface of the frustro-conical shape. The inner-surface and the conical surface have complementary shape. A top surface of the confinement structure is substantially planar. The confinement structure may fit around the frustro-conical shape of the last lens element. A bottom surface of the liquid confinement structure is substantially planar and in use the bottom surface may be parallel with the facing surface of the table and/or wafer. The distance between the bottom surface and the facing surface may be in the range of 30 to 500 micrometers, desirably in the range of 80 to 200 micrometers.

The confinement structure extends closer to the facing surface of the wafer and wafer table than the last lens element. A space 10 is therefore defined between the inner surface of the confinement structure, the planar surface of the frustro-conical portion and the facing surface. During use, the space is filled with liquid. The liquid fills at least part of a buffer space between the complementary surfaces between lens and the confinement structure, in an embodiment at least part of the space between the complementary inner-surface and the conical surface.

Liquid is supplied to the space through an opening formed in the surface of the liquid confinement structure. The liquid may be supplied through a supply opening 20 in the inner-surface of the liquid confinement structure. Alternatively or additionally, the liquid is supplied from an under supply opening 23 formed in the undersurface of the confinement structure 12. The under supply opening may surround the path of the projection beam and it may be formed of a series of openings in an array. The liquid is supplied to fill the space 10 so that flow through the space under the projection system is laminar. The supply of liquid from the opening 23 under the liquid confinement structure additionally prevents the ingress of bubbles into the space. This supply of liquid functions as a liquid seal.

The liquid may be recovered from a recovery opening 21 formed in the inner-surface. The recovery of the liquid through the recovery opening may be by application of an under pressure; the recovery through the opening 21 as a consequence of the velocity of the liquid flow through the space; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12.

Additionally or alternatively, liquid may be recovered from under the liquid confinement structure through a bottom recovery opening 25, 32. The bottom recovery opening may serve to hold (or 'pin') a liquid meniscus to the liquid confinement structure. The meniscus forms between the liquid confinement structure and the facing surface and it serves as border between the liquid space and the gaseous external environment. The bottom recovery opening 25 may be a porous plate 25 which may recover the liquid in a single phase flow. The bottom recovery opening may be a series of pining openings 32 through which the liquid is recovered. The pining openings may recover the liquid in a two phase flow.

Optionally radially outward, with respect to the inner-surface of the liquid confinement structure, is a gas knife opening 26. Gas may be supplied through the gas knife opening at elevated speed to assist confinement of the immersion liquid in the space. The supplied gas may be humidified and it may contain carbon dioxide. The supplied gas may consist essentially of carbon dioxide and water vapor. Radially outward of the gas knife opening is a gas recovery opening 18 for recovering the gas supplied through the gas knife.

Features shown in FIG. 3 which are common to FIG. 2 share the same reference numbers. The confinement structure 12 has an inner surface which complements the conical surface of the frustro-conical shape of the last lens element 100. The undersurface of the confinement structure is closer to the facing surface than the bottom planar surface of the frustro-conical shape.

Liquid is supplied to the space through supply openings formed in the inner surface of the confinement structure. The supply openings 34 are located towards the bottom of the inner surface, perhaps below the bottom surface of the fustro-conical shape. The supply openings are located on the inner surface, spaced apart around the path of the projection beam.

Liquid is recovered from the space 10 through recovery openings 25 in the undersurface of the liquid confinement structure 12. As the facing surface moves under the confinement structure, the meniscus 33 may migrate over the surface of the recovery opening 25 in the same direction as the movement of the facing surface. The recovery openings may be formed of a porous member. The liquid may be recovered in single phase. In an embodiment the liquid is recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of confinement structure extends into the space away from the inner surface to form a plate 40. The inner periphery forms a small aperture which may be sized to match the shape and size of the projection beam. The plate may serve to isolate liquid either side of it. The supplied liquid flows inwards towards the aperture, through the inner aperture and then under the plate radially outwardly towards the surrounding recovery openings 25.

In an embodiment the confinement structure may be in two parts: an inner part 12a and an outer part 12b. For convenience this arrangement is shown in the right-hand part of FIG. 3. The two parts may move relatively to each other, in a plane parallel to the facing surface. The inner part may have the supply openings 34 and it may have the overflow recovery 24. The outer part 12b may have the plate 40 and the recovery opening 25. The inner part may have an intermediate recovery 42 for recovering liquid which flows between the two parts.

Contamination of various types can adversely affect the performance of a fluid handling system in a lithographic apparatus. Although the environment of the lithographic apparatus is kept to a very low contaminant level and the immersion liquid, e.g. water, is very pure, the possibility of particulate contamination of the fluid handling system cannot be wholly eradicated. The presence of even small contaminants at critical locations within the fluid handling system can reduce its effectiveness.

For example, the presence of a fiber on, for example adhered to, the lower surface of a liquid confinement structure 12 may increase defectivity and may contribute to a reduction in productivity. The presence of a fiber adjacent, or even over, a water extraction orifice can lead to additional water loss onto a production substrate during exposures. Also, a partial or complete blockage of a gas outlet forming part of a gas seal for confining the immersion liquid can lead to water loss onto a production substrate. Water loss on a production substrate can cause defects in exposed patterns. The defects may be formed through the creation of watermarks on the resist as a consequence of evaporating droplets. In a different mechanism, a bubble may be generated on collision between the meniscus 33 of the confined immersion liquid and a droplet remaining on the substrate. The bubble may travel in the immersion space to interfere with the path of the projection beam.

If the presence of a contaminant in the lithographic apparatus has been detected (e.g. using an inspection substrate) or inferred (e.g. from a decrease in yield due to an increase in the number of defects in exposed patterns) it is desirable to clean the relevant component(s) of the lithographic apparatus. Conventionally, this has been done by opening the lithographic apparatus and removing or dismantling other components to enable access to the component(s) to be cleaned. The relevant components are then cleaned, often manually. This process is time consuming and presents a risk of contamination since further contaminants may find their way into the lithographic apparatus whilst it is open to the cleanroom and migrate to sensitive components. Opening the lithographic apparatus to perform a cleaning operation can therefore lead to the need to perform a series of cleaning operations resulting in extensive downtime.

Figure 4:
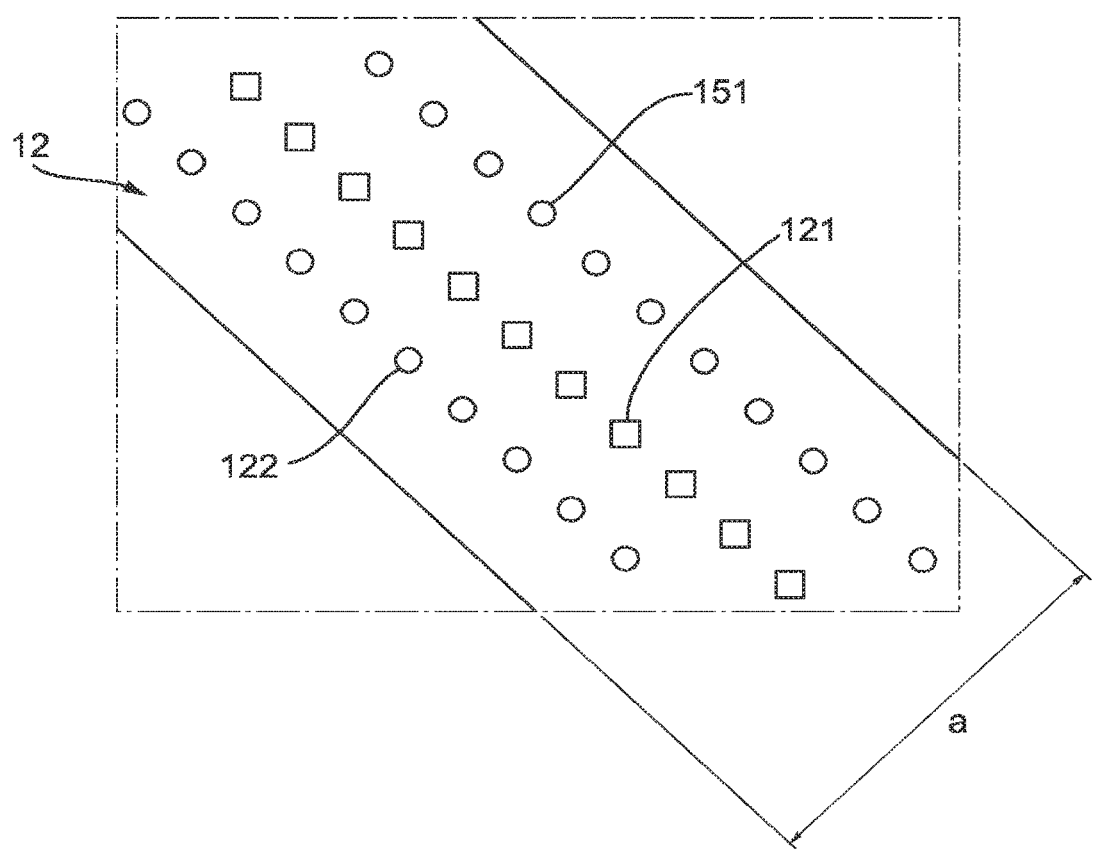
FIG. 4 depicts the underside of a part of an immersion liquid confinement structure for use in a lithographic projection apparatus.

FIG. 4 depicts the underside of a liquid confinement structure 12 in a lithographic apparatus. The lower surface of the liquid confinement structure 12, that is the surface which faces the substrate W during operation of the lithographic apparatus, is provided with several generally parallel rows of apertures. The rows arranged may be generally arranged concentrically around the immersions space. As described with reference to FIGS. 2 and 3, they may be used to help confine the immersion liquid to the immersion space 11. These apertures may include (in a non-limited list) gas seal apertures 151, liquid extraction apertures 121 and liquid supply apertures 122.

The gas seal apertures 151 are supplied, when operating, with gas at a high pressure so as to form a high pressure region between the liquid confinement structure 12 and substrate W. The high pressure region functions to confine the immersion liquid to the immersion space 11 and is referred to as a gas seal. The liquid extraction apertures 121 are connected to a low pressure source and in use extract gas and/or immersion liquid in a one or two phase flow. The liquid extraction apertures 121 can function as a meniscus pinning feature. Liquid supply apertures 122 supply liquid to the immersion space, e.g. to replenish liquid removed through the liquid extraction apertures 121.

The total width a of the liquid confinement structure 12, may be of the order of 4 to 40 mm, or larger. The various apertures described may have different sizes, e.g. of the order of 10 µm to 1 mm. Therefore, a small contaminant particle can easily block or disrupt the flow around any of the apertures. If the contaminant is a fiber, a single fiber could obstruct one or more openings along a row of openings.

Figure 5:
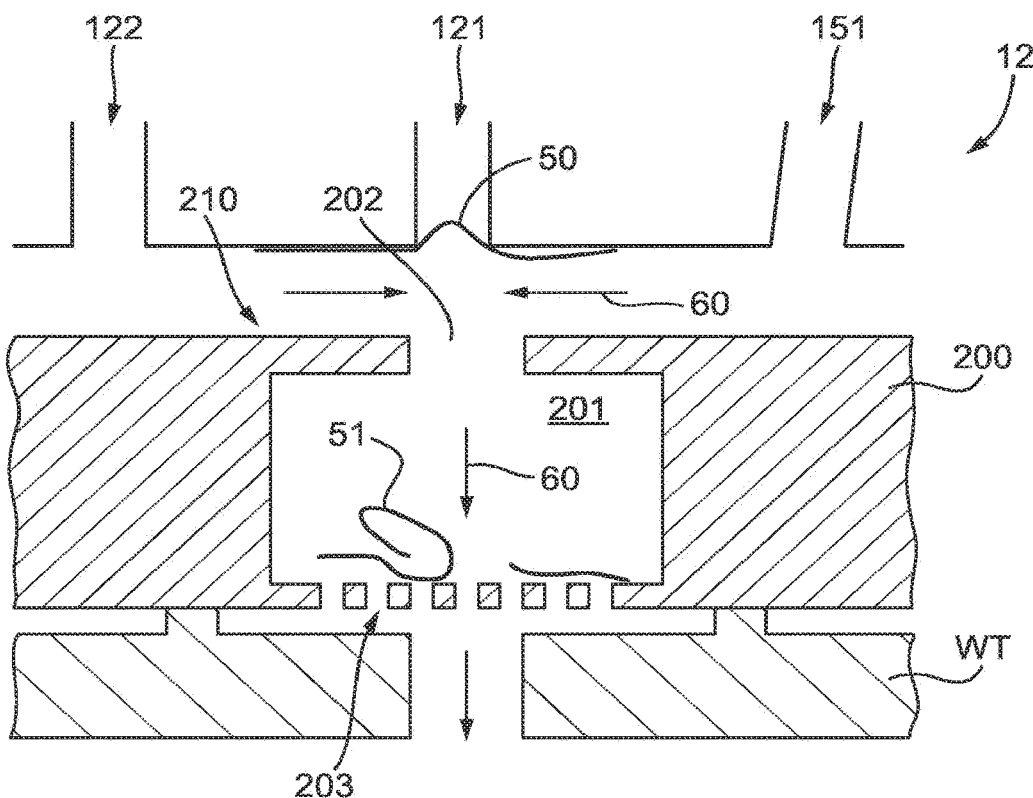
FIG. 5 depicts in partial cross-section a cleaning device 200 according to an embodiment of the invention in operation.

FIG. 5 depicts a cleaning device 200 according to an embodiment of the present invention.

Cleaning device 200 is in the form of a wafer that can be loaded into the lithographic apparatus LT as if it were a production substrate to be exposed. The cleaning device 200 is interchangeable with a production substrate. The cleaning device 200 is compatible with the lithographic apparatus because it has dimensions similar to that of a production substrate. The cleaning device 200 is configured to clean a component, or a part of a component, of the lithographic apparatus.

During cleaning, the cleaning device 200 is adjacent, or proximate to the component. The component may be a functional subsystem of the lithographic apparatus such as a liquid confinement system or a part of a functional subsystem. A cleaning device 200 according to an embodiment of the present invention is particularly useful in cleaning a liquid confinement system, especially a liquid confinement structure. A feature of the liquid confinement structure which the cleaning device 200 may be used to clean is the undersurface of the liquid confinement structure. Features present in the undersurface such as the openings for the passage of liquid and gas can be cleaned using the cleaning device 200 of the present invention. The cleaning device can also be used to clean grid plates, which are used to measure the position and/or displacement of the substrate table WT, and sensors, such as a level sensor.

Cleaning device 200 comprises a body that can be loaded into and transported by the lithographic apparatus. The body may be made of the same material as production substrate. The body may have dimensions similar to, or substantially the same as, a production substrate. Therefore, the cleaning device 200 can be loaded into and handled by the lithographic apparatus in the same way as a production substrate. The body 200 may be a silicon wafer, e.g. of diameter 300 mm or 450 mm.

Embedded in body is a cleaning unit 210. Cleaning unit 210 comprises a chamber 201 in the body of cleaning device 200 which is in fluid communication with the space above cleaning device 200 via opening 202. Chamber 201 is also in fluid communication with the space below cleaning device 200 via filter 203.

Opening 202 is sufficiently large to allow contaminant particles 50, which may be adhered to the object to be cleaned (e.g. liquid confinement structure 12), to pass into the chamber 201. Opening 202 may be any convenient shape in cross-section, e.g. circular, square, elongate. A circular opening is convenient to manufacture. Opening 202 may have a constant cross-section through-out its depth but this is not essential. Opening 202 may have a diameter or width in the range of from about 100 µm to about 500 µm, desirably about 200 µm to about 250 µm.

Filter 203 is configured to trap contaminants 51, that have entered chamber 201, by preventing them leaving chamber 201. Filter 203 may comprise a plurality of small openings, smaller than the contaminants to be trapped, a plurality of sinuous paths or a mass of fibrous material configured to trap contaminants.

As depicted in FIG. 5, when the cleaning device 200 is placed on the substrate holder WH, an under-pressure in the space below the cleaning device, i.e. between the cleaning device 200 and substrate holder WH, causes a gas flow 60 from the space above the cleaning device, i.e. between the cleaning device and the object to be cleaned, through the opening 202, chamber 201 and filter 203. The under-pressure in the space below the cleaning device can be generated by a vacuum source that is conventionally used to generating a clamping force to hold a production substrate onto the substrate holder.

In some embodiments, the normal clamping under-pressure can generate sufficient gas flow for the purposes of the invention. In other cases a higher gas flow may be desirable in which case the vacuum source can be operated at a higher rate to reduce the pressure below the cleaning device. In some cases, or if an electrostatic clamp is used to hold production substrates on the substrate holder, an additional vacuum source can be provided.

The gas flow 60 into the chamber 201 entrains contaminants 50 that are close to the opening 202, e.g. attached to the object to be cleaned, and draws them into the chamber 201. How close to the opening 202 a contaminant 50 must be in order to be drawn into the chamber 201 depends on a number of factors including for example: the size of the under-pressure below the cleaning device; the flow resistance through the chamber 201; the size of the contaminant; and the strength of the adhesion between the contaminant and the object to be cleaned. However, because the substrate table WT is capable of highly precise positioning, the cleaning device can be positioned very close to the object to be cleaned so that high gas flow rates arise in the gap between cleaning device and object to be cleaned. Such high gas flow rates can provide the cleaning device with a large effective cleaning range.

In some cases, a fluctuating gas flow can assist in dislodging contaminants from the object to be cleaned. A fluctuating gas flow can be generated by varying the power of the vacuum source. Alternatively or in addition, a fluctuating gas flow can be generated by reciprocating the substrate holder in any of the X, Y and Z directions.

Figure 6:
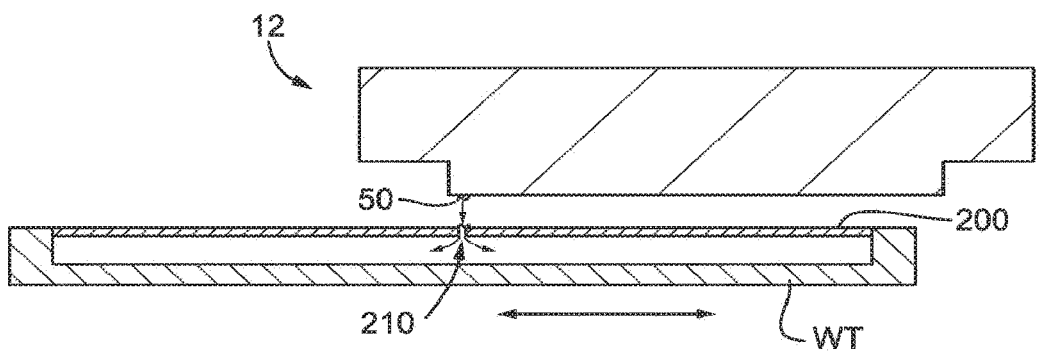
FIG. 6 depicts the cleaning device 200 of FIG. 5 at a larger scale.

To remove contaminants from a larger area of the object to be cleaned, the substrate table, holding the cleaning device 200, can be scanned relative to the object to be cleaned, as shown in FIG. 6.

Cleaning device 200 can be provided with a plurality of cleaning units to enable cleaning of a plurality of areas of the object simultaneously. A cleaning unit may comprise a plurality of openings 202 in fluid communication with a single chamber 201.

After the cleaning process has been completed, the cleaning device is unloaded from the lithographic apparatus using the conventional substrate handling system. Once removed from the lithographic apparatus, contaminants that have accumulated in the chamber can be removed, e.g. by causing gas to flow through the cleaning unit(s) in reverse. The contaminants can then be analyzed to assist in creating preventative measures, reducing future contamination. However, since the quantity of contaminants recovered in a cleaning process is expected to be very small, it is possible to use the cleaning device multiple times without removing contaminants that have collected in the chamber(s) 201. Since the cleaning device is passive, it is cheap to manufacture and does not contain any hazardous substances so can be discarded after use.

Desirably the various components of cleaning device 200 do not project out of either major surface of the body any more than is acceptable by the lithographic apparatus, for example no more than 20 micrometers or desirably less. In the event that one or more components of the cleaning device 200 are not perfectly flush with an outer surface of body 200, an additional planarization layer (such as a coating) can be provided to the respective outer surface to ensure that the relevant surface matches the flatness specifications required by the lithographic apparatus.

In an embodiment of the invention, cleaning device 200 is provided with a plurality of cleaning units so as to enable the object to be cleaned more quickly. The arrangement of cleaning units on cleaning device 200 can be optimized to at least a part of the shape of the object to be cleaned so as to most efficiently clean it. If the cleaning units form a pattern which matches the shape of the object, then the cleaning of the object can be performed most efficiently. If the pattern formed by the cleaning units formed on the cleaning device 200 corresponds to a part of a shape of the object, a number of cleaning steps would be performed before the cleaning of the object is complete.

Figure 7:
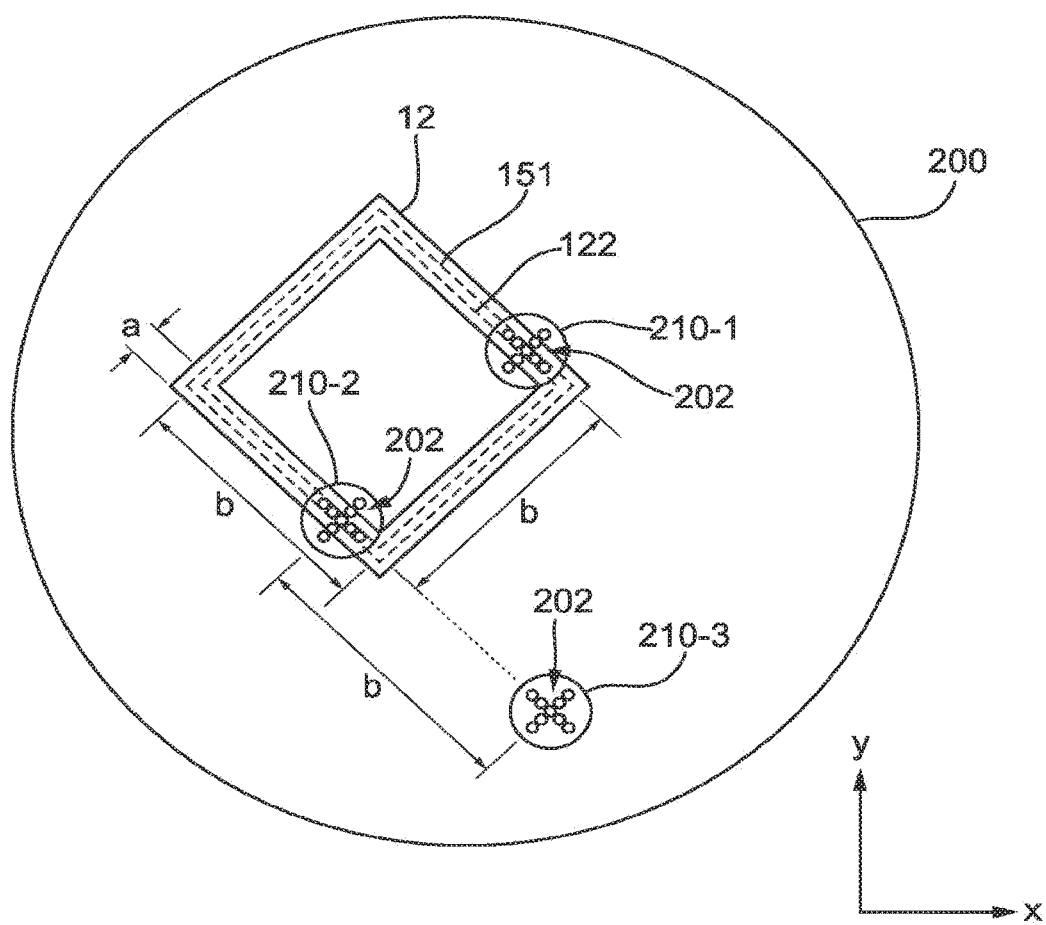
FIG. 7 depicts in plan view the cleaning device 200 of FIG. 5.

For example, in an embodiment of cleaning device 200 to clean the complete lower surface of a liquid confinement structure 12 that has the shape in plan of a square frame oriented at 45° to x and y axes of the apparatus, an arrangement of cleaning units 210 as shown in FIG. 7 can be used. This arrangement comprises three cleaning units 210 each having a cleaning range having a dimension at least equal to the width of one side of the liquid confinement structure 12, or more specifically, or in the alternative, the width of a row of openings forming a pattern on the underside of the liquid confinement structure 12. Each cleaning unit 210 comprises a plurality of openings 202, e.g. nine, arranged in a cross-shape with the arms of the cross oriented parallel and perpendicular to the sides of the square frame of the liquid confinement structure 12. The openings 202 in each cleaning unit communicate with one or more chambers 201.

The cleaning units 210-1, 210-2 and 210-3 are spaced apart by a distance b equal to the length of one side of the liquid confinement structure. The length 'b' may more specifically, or in the alternative, be the separation between centers of the sides of the liquid confinement structure 12. In use, the cleaning device 200 is orientated in the lithographic apparatus such that the two of the cleaning units, e.g. 210-1, 210-2 can be located under a pair of adjoining corners of the shaped formed by the rows of opening in the undersurface of the liquid confinement structure 12. Thus, an imaginary line joining two of the cleaning units, e.g. 210-1 and 210-2, is parallel to one side (e.g. a first side) of the liquid confinement structure 12.

In the same orientation of the cleaning device 200 relative to the lithographic apparatus another pair of the cleaning units, e.g. 210-2, 210-3 can be located under another pair of adjoining corners of the shaped formed by the rows of opening in the undersurface of the liquid confinement structure 12. Thus, an imaginary line joining another two of the cleaning units, e.g. imaging devices 210-2 and 210-3, is parallel to another side (e.g. a second side) of liquid confinement structure 12. The first and second sides may be adjoining sides of the shape in the undersurface of the liquid confinement structure 12.

With such an arrangement and a liquid confinement structure of that shape, two opposite sides of liquid confinement structure 12 can be scanned simultaneously with one movement of cleaning device 200 relative to liquid confinement structure 12. The other two opposing sides of liquid confinement structure 12 can then be cleaned with a single further scan of cleaning device 200 relative to liquid confinement structure 12.

Additional cleaning units 210-$n$ may be located on the cleaning device 200. The additional cleaning units 210-$n$ may be spaced apart by a distance equal to a fraction of the distance b along imaginary lines parallel to the sides of the liquid confinement structure 12. Having additional cleaning units 210-$n$ can allow a whole side of the liquid confinement structure 12 to be cleaned in a shorter scan.

FIG. 7 also depicts features of the undersurface of the liquid confinement structure 12: a linear array of gas openings 151, and a linear array of liquid supply openings 122. Although these features of a liquid confinement structure are explicitly depicted, they are intended to correspond to any features, such as openings, present in the surface of the object to be cleaned.

Another embodiment of a cleaning device is depicted in FIG. 8. The cleaning device 200a of FIG. 8 is the same as the cleaning device 200 of FIG. 5 save as described below. Common parts are not described again in the interests of brevity. Cleaning device 200a has one or more cleaning projections 204 from its upper surface in the vicinity of opening 202. Cleaning projections 204 can assisting dislodging contaminants from the object to be cleaned by scanning the cleaning device relative to the object to be cleaned. Cleaning projections 204 are desirably formed from a soft, e.g. resilient, material so that they will not damage the object to be cleaned. Suitable materials include silicone, fluoroelastomers and perfluoro-elastomers. In some cases it is possible to position the cleaning device relative to the object to be cleaned with sufficient precision that the cleaning projections do not contact the object to be cleaned but are still close enough to dislodge contaminants adhering to the surface of the object.

Cleaning projections 204 can also be configured to guide gas flow in the vicinity of the opening 202 to enhance the removal of contaminants. In cleaning device with multiple cleaning units not all of the cleaning units need be provided with cleaning projections. With such an arrangement, cleaning units with no projections may be used first, and a cleaning unit with projections only brought into use if necessary to remove strongly adhered contaminants. In this way the risk of damage to the object to be cleaned from the cleaning projections is minimized.

Another embodiment of a cleaning device is depicted in FIG. 9. The cleaning device 300 of FIG. 9 is the same as the cleaning device 200 of FIG. 5 save as described below. Common parts are not described again in the interests of brevity. Cleaning device 300 is provided with a seal member 301 that forms a projecting annulus from the top surface of the cleaning device 300. Seal member 301 forms a contaminant collecting chamber that is open at the upper side. Seal member 301 is formed of a resistant material, such as silicone, fluoroelastomers and perfluoro-elastomers. An outlet 303 creates a gas flow path from the contaminant collecting chamber to the lower surface of cleaning device 300 and is provided with a filter 302. Seal member 301 is positioned to surround an aperture in the object to be cleaned, e.g. an extraction opening 121.

In use, the cleaning device 330 is placed against the object to be cleaned so that a gas flow though the aperture 121 and cleaning device 300 entrains any contaminants in the aperture 121 and takes them to the chamber defined by seal member 301. This embodiment is particularly effective at removing contaminants in apertures in the object to be cleaned rather than on surfaces thereof. Although shown as having the form of a cup, seal member 301 can be a simple ring, with the bottom of the chamber formed by the body of the cleaning device 300.

Figure 10:
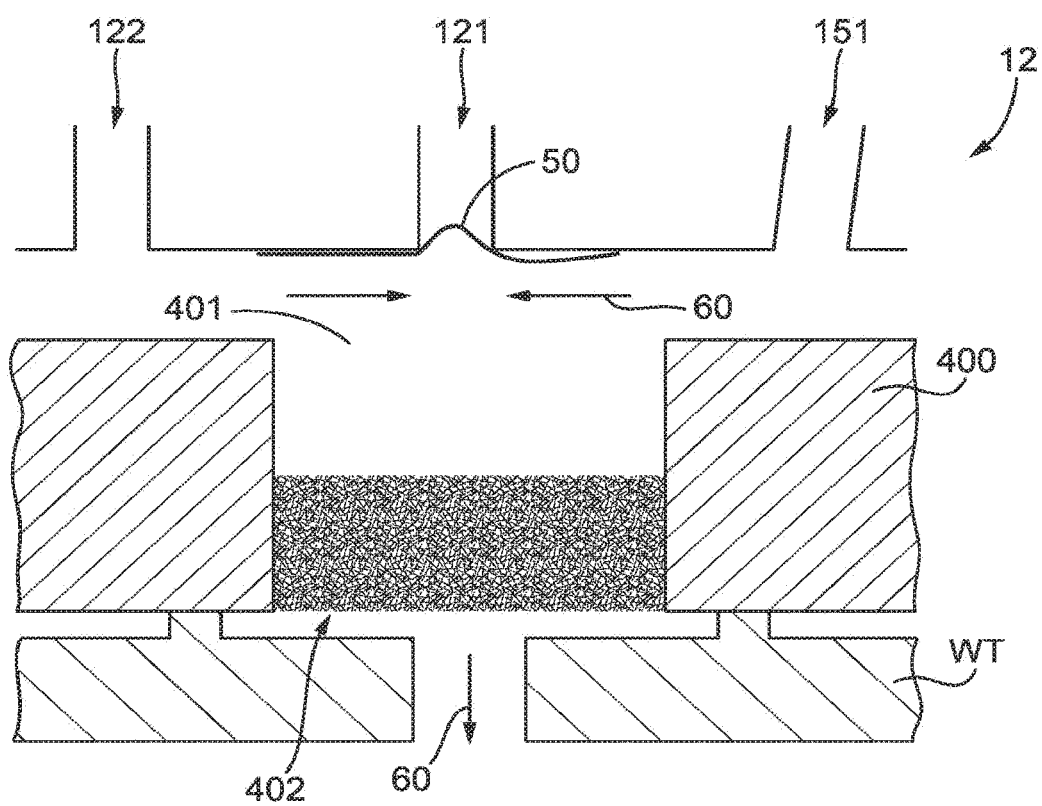
FIG. 10 depicts in partial cross-section a cleaning device 200 according to another embodiment of the invention in operation.

Another embodiment of a cleaning device is depicted in FIG. 10. The cleaning device 400 of FIG. 9 is the same as the cleaning device 200 of FIG. 5 save as described below. Common parts are not described again in the interests of brevity. Cleaning device 400 has a cleaning unit formed by a through-hole 401 in the body and a filter 402 partly filling the through-hole 401. Contaminants entrained in a gas flow through the through-hole 401 are captured in the filter 402. The filter 402 is selected to control the rate of flow of gas through the through-hole. Desirably the filter is made of a material that is vacuum compatible, i.e. has minimal outgassing, and is not a source of particles to minimize the risk that the filter itself introduces contaminants into the apparatus.

FIG. 11 depicts a method of use of the cleaning device 200 to clean internal functional subsystems, such as the liquid confinement system, of the lithographic apparatus without opening the lithographic apparatus. Therefore, the downtime required for cleaning is greatly reduced and the risk of further contamination avoided. A cleaning device, e.g. cleaning device 200, is loaded 51 into the lithographic apparatus in exactly the same way as a resist-coated substrate (or production substrate) is loaded for exposure. Cleaning device 200 is placed onto substrate table 60 by a substrate handler, for example. A vacuum source is activated S2 to clamp the cleaning device to the substrate table 60.

Once loaded into the lithographic apparatus and placed on the substrate table 60, cleaning device 200 may be subjected to certain prequalification steps, e.g. flatness measurements, to validate the cleaning device 200 and verify that it will not damage the lithographic apparatus. However a complete pre-characterization and temperature conditioning process as normally performed for production substrates need not be applied.

After any such initial steps, cleaning device 200 is positioned S3 by substrate table 60 so that a cleaning unit 210 is positioned underneath and facing the relevant part of the object to be cleaned, e.g. the lower surface of immersion liquid confinement structure 12. In positioning the cleaning device 200 on the substrate table 60, the cleaning device 200 is orientated in a preferred direction, for example so that cleaning units on the substrate are appropriately orientated with respect to features of the inspected object, such as the openings in the undersurface of the liquid confinement structure 12. In a lithographic apparatus with separate measurement and exposure stations, this may involve a transfer of the cleaning device 200 to the exposure station.

When the cleaning device is in the correct position, a cleaning vacuum source is activated S4, if necessary. This step may be omitted if the clamping vacuum source is capable of generating sufficient gas flow for cleaning. In an embodiment, activating a cleaning vacuum source comprises increasing the power of the clamping vacuum source to draw a deeper vacuum in the space below the cleaning device.

With a suitable gas flow through the cleaning device, the cleaning device is scanned S5 across the area or areas to be cleaned of the object. If the location of a contaminant is known or predictable, it is possible to clean only that part of the object. This step can be omitted if the area(s) to be cleaned fit within the effective cleaning range of the cleaning unit(s) 210.

During the cleaning process, gas or immersion liquid may be supplied through relevant openings of the object to be cleaned, e.g. gas seal apertures 151, liquid extraction apertures 121 and/or liquid supply apertures 122, to create an increased fluid flow. This can enhance the removal of contaminants. The supply of gas or immersion liquid need not be continuous or for the whole of the cleaning process.

If desired, the cleaning device 200 is reciprocated S6 in the Z direction to create a fluctuating gas flow to assist in dislodging contaminants from the object. Similarly, the vacuum source can be oscillated S7 to create a fluctuating gas flow.

Once the cleaning process is completed, it is desirable to determine whether it has been effective and all contaminants have been removed. In some cases this can be done by operating the relevant functional subsystem and detecting whether it is operating correctly. In other cases, an inspection substrate, such as disclosed in WO2017/008993, can be used to determine whether or not any contaminants have been removed. Use of a cleaning device as described herein and an inspection substrate together is particularly advantageous as the complete process of detecting contaminants, cleaning the object and verifying the cleaning process can be performed without opening the lithographic apparatus. This minimizes the downtime and avoids the potential for an undesirable cycle of more contaminants being introduced when attempting to deal with contaminants.

Although the present invention has been described above in relation to use of the cleaning device to inspect a functional subsystem of a lithographic apparatus, the cleaning device can also be used to inspect a functional subsystem of another apparatus, such as a metrology apparatus. A cleaning device according to an embodiment of the present invention can be used in a process device of the track provided that the cleaning device is capable of withstanding conditions prevailing in the track, e.g. high temperatures and application of materials such as coatings. A cleaning device according to an embodiment can be used in a test bed or partial apparatus.

Embodiments are Provided According to the Following Clauses

1. A cleaning device for an apparatus for processing production substrates, the cleaning device comprising:
    a body having dimensions similar to the production substrates so that the cleaning device is compatible with the apparatus, the body having a first major surface and a second major surface facing in an opposite direction to the first major surface;
    a chamber within the body configured to accommodate contaminants;
    an inlet from the first major surface to the chamber and configured to allow contaminants to be drawn into the chamber by a flow of fluid; and
    an outlet from the chamber to the second major surface, the cleaning device being configured to allow the fluid to exit the chamber but to prevent a contaminant leaving the chamber.

2. A cleaning device according to clause 1, wherein a cross-section of the inlet has a smallest dimension in the plane of the first major surface in the range of from about 200 μm to about 500 μm.

3. A cleaning device according to clause 1 or clause 2 wherein the outlet is provided with a filter having apertures smaller than about 1 μm.

4. A cleaning device according to any of clauses 1 to 3, having a plurality of inlets.

5. A cleaning device according to clause 4, wherein the plurality of inlets are arranged to span a width of a part of a component of the apparatus to be cleaned.

6. A cleaning device according to clause 4 or clause 5, wherein the plurality of inlets are arranged into at least a first group of inlets and a second group of inlets, the first and second groups being spaced apart so that two parts of a component of the apparatus can be cleaned simultaneously.

7. A cleaning device according to clause 5 or clause 6, wherein the component is a liquid confinement member.

8. A cleaning device according to any of clauses 4 to 7, having a plurality of chambers.

9. A cleaning device according to clause 8, wherein each of the inlets is connected to a respective one of the chambers.

10. A cleaning device according to any of clauses 1 to 9, further comprising a plurality of cleaning members projecting from the first major surface near the or an inlet.

11. A method of cleaning an apparatus for processing production substrates, the method comprising:
    loading a cleaning device according to any of clauses 1 to 10 onto a substrate holder of the apparatus, the second major surface of the cleaning device being adjacent the substrate holder;
    moving the substrate holder having the cleaning device thereon so that an inlet of the cleaning device is adjacent a part of a component of the apparatus to be cleaned; and
    operating a vacuum source to create an under-pressure between the cleaning device and the substrate holder so that fluid is drawn through the inlet, chamber and outlet.

12. A method according to clause 11, further comprising moving the substrate holder and/or the part of the component to scan the inlet across the part of the component of the apparatus to be cleaned whilst the vacuum source is operating.

13. A method according to clause 11 or clause 12, further comprising reciprocating the substrate holder and or the part of the component whilst the inlet is adjacent the part of the component of the apparatus to be cleaned to create a fluctuating force on any contaminant adhered to the part of the component.

14. A method according to any of clauses 11 to 13, wherein the vacuum source is operated when the cleaning device is loaded onto the substrate holder so as to generate a clamping force therebetween.

15. A method according to clause 14, further comprising increasing the operating level of the vacuum source when the substrate holder is adjacent the part of the component of the apparatus to be cleaned.

16. A method according to clause 15, wherein the component is a liquid confinement member comprising an immersion liquid supply outlet,
    the method further comprising supplying immersion liquid through the immersion liquid supply outlet while the inlet of the cleaning device is adjacent the part of the component of the apparatus to be cleaned.

17. A method according to any of clauses 11 to 16, further comprising varying the operating level of the vacuum source when the substrate holder is adjacent the part of the component of the apparatus to be cleaned.

18. A computer program comprising code means that, when executed by the control system of an apparatus for processing production substrates, causes the apparatus for processing production substrates to perform a method according to any of clauses 11 to 17.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 405, 365, 248, 193, 157 or 126 nm). and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive reflective, magnetic, electromagnetic and electrostatic optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A cleaning device for an apparatus for processing production substrates, the cleaning device comprising:
   a body having dimensions similar to the production substrates so that the cleaning device is locatable in the apparatus at a location where production substrates are locatable in the apparatus, the body having a first major surface and a second major surface facing in an opposite direction to the first major surface;
   a chamber within the body configured to accommodate contaminants;
   an inlet from the first major surface to the chamber and configured to allow contaminants to be drawn into the chamber by a flow of fluid; and
   an outlet from the chamber to the second major surface, the cleaning device having structure configured to allow the fluid to exit the chamber but to prevent a contaminant leaving the chamber.

2. The cleaning device according to claim 1, wherein a cross-section of the inlet has a smallest dimension in a plane of the first major surface in the range of from about 200 μm to about 500 μm.

3. The cleaning device according to claim 1, wherein the outlet is provided with a filter having apertures smaller than about 1 μm.

4. The cleaning device according to claim 1, having a plurality of inlets.

5. The cleaning device according to claim 4, wherein the plurality of inlets are arranged to span a width of a part of a component of the apparatus to be cleaned.

6. The cleaning device according to claim 4, wherein the plurality of inlets are arranged into at least a first group of inlets and a second group of inlets, the first and second groups being spaced apart so that two parts of a component of the apparatus can be cleaned simultaneously.

7. The cleaning device according to claim 5, wherein the component is a liquid confinement member.

8. The cleaning device according to claim 4, having a plurality of chambers.

9. The cleaning device according to claim 8, wherein each of the inlets is connected to a respective one of the chambers.

10. The cleaning device according to claim 1, further comprising a plurality of cleaning members projecting from the first major surface near the inlet or near another inlet.

11. A method of cleaning an apparatus for processing production substrates, the method comprising:
    loading a cleaning device onto a location on a substrate holder of the apparatus where production substrates are loaded, the cleaning device comprising:

a body having a first major surface and a second major surface facing in an opposite direction to the first major surface, the second major surface being adjacent the substrate holder, a chamber within the body configured to accommodate contaminants, an inlet from the first major surface to the chamber and configured to allow contaminants to be drawn into the chamber by a flow of fluid, and an outlet from the chamber to the second major surface, the cleaning device having structure configured to allow the fluid to exit the chamber but to prevent a contaminant leaving the chamber;

moving the substrate holder having the cleaning device thereon so that the inlet of the cleaning device is adjacent a part of a component of the apparatus to be cleaned; and creating an under-pressure between the cleaning device and the substrate holder so that fluid is drawn through the inlet, chamber and outlet.

12. The method according to claim 11, further comprising moving the substrate holder and/or the part of the component to scan the inlet across the part of the component of the apparatus to be cleaned whilst the under-pressure is provided.

13. The method according to claim 11, further comprising reciprocating the substrate holder and/or the part of the component whilst the inlet is adjacent the part of the component of the apparatus to be cleaned to create a fluctuating force on any contaminant adhered to the part of the component.

14. The method according to claim 11, wherein the under-pressure is provided when the cleaning device is loaded onto the substrate holder so as to generate a clamping force therebetween.

15. The method according to claim 14, further comprising increasing the under-pressure force when the substrate holder is adjacent the part of the component of the apparatus to be cleaned.

16. The method according to claim 11, wherein the component is a liquid confinement member comprising an immersion liquid supply outlet, and the method further comprises supplying immersion liquid through the immersion liquid supply outlet while the inlet of the cleaning device is adjacent the part of the component of the apparatus to be cleaned.

17. The method according to claim 11, further comprising varying the under-pressure force when the substrate holder is adjacent the part of the component of the apparatus to be cleaned.

18. A computer program product comprising a non-transitory computer-readable medium having instructions therein, the instructions, when executed by a control system of an apparatus for processing production substrates, configured to cause the apparatus for processing production substrates to at least:

cause movement of a substrate holder having a cleaning device loaded thereon so that an inlet of the cleaning device is adjacent a part of a component of the apparatus to be cleaned, the cleaning device comprising:

a body having a first major surface and a second major surface facing in an opposite direction to the first major surface, the second major surface arranged to be adjacent the substrate holder, a chamber within the body configured to accommodate contaminants, the inlet, the inlet being from the first major surface to the chamber and configured to allow contaminants to be drawn into the chamber by a flow of fluid, and an outlet from the chamber to the second major surface, the cleaning device having structure configured to allow the fluid to exit the chamber but to prevent a contaminant leaving the chamber;

cause creation of an under-pressure between the cleaning device and the substrate holder so that fluid is drawn through the inlet, chamber and outlet; and cause unloading of the cleaning device from the substrate holder by a handler configured to process production substrates.

19. The computer program product of claim 18, wherein the instructions, when executed by the control system of the apparatus, are further configured to cause the apparatus to move the substrate holder and/or the part of the component to scan the inlet across the part of the component of the apparatus to be cleaned whilst the under-pressure is provided.

20. The computer program product of claim 18, wherein the instructions, when executed by the control system of the apparatus, are further configured to cause the apparatus to reciprocate the substrate holder and/or the part of the component while the inlet is adjacent the part of the component of the apparatus to be cleaned to create a fluctuating force on any contaminant adhered to the part of the component.

* * * * *